(12) United States Patent
Shimomura et al.

(10) Patent No.: US 8,207,632 B2
(45) Date of Patent: Jun. 26, 2012

(54) CONTROL DEVICE FOR UNINTERRUPTIBLE POWER SUPPLY

(75) Inventors: Junichi Shimomura, Tokyo (JP); Satoru Ohishi, Yamato (JP); Kenichi Suzuki, Sagamihara (JP)

(73) Assignees: Meidensha Corporation, Tokyo (JP); The Tokyo Electric Power Company, Incorporated, Tokyo (JP)

( * ) Notice: Subject to any disclaimer, the term of this patent is extended or adjusted under 35 U.S.C. 154(b) by 234 days.

(21) Appl. No.: 12/521,161

(22) PCT Filed: Dec. 10, 2007

(86) PCT No.: PCT/JP2007/073796
§ 371 (c)(1),
(2), (4) Date: Jun. 25, 2009

(87) PCT Pub. No.: WO2008/084617
PCT Pub. Date: Jul. 17, 2008

(65) Prior Publication Data
US 2010/0007211 A1    Jan. 14, 2010

(51) Int. Cl.
*H02J 9/00* (2006.01)
(52) U.S. Cl. .......................... 307/66; 307/64
(58) Field of Classification Search ........... 307/64–66
See application file for complete search history.

(56) References Cited

U.S. PATENT DOCUMENTS

| | | | | |
|---|---|---|---|---|
| 5,302,858 A | * | 4/1994 | Folts | 307/66 |
| 5,633,577 A | * | 5/1997 | Matsumae et al. | 322/37 |
| 5,646,502 A | * | 7/1997 | Johnson | 307/66 |
| 5,929,538 A | * | 7/1999 | O'Sullivan et al. | 307/66 |

(Continued)

FOREIGN PATENT DOCUMENTS

JP    2005-287125 A    10/2005
(Continued)

OTHER PUBLICATIONS

Kenichi Suzuki et al., "PCS for NaS cell having instantaneous voltage drop counter-measure function", Meiden Review, vol. 3 (2006), pp. 22-25.

*Primary Examiner* — Adi Amrany
(74) *Attorney, Agent, or Firm* — Foley & Lardner LLP (57) ABSTRACT

[Task]
In a power conversion system, a variation in PCS alternating current voltage is suppressed during a change operation to a self-contained run according to an instantaneous voltage drop-service interruption.
[Means for solving the task]
During an ordinary system voltage stabilization, with change switch 25 changed to the output side of APR control circuit 22 and change switch 400 changed to the output side of charge/discharge run PWM command value preparing section 200, the power conversion system is run in a charge/discharge run mode. If the instantaneous voltage drop or the service interruption occurs, change switch 25 is changed to the output side of the self-contained run change prior current command value preparing section 60 and the constant current discharge run is carried out in which the electric power is discharged for a predetermined time duration in response to the current command value of the self-contained run change prior current command value preparing section 60. Thus, after a predetermined time has elapsed, change switch 400 is changed to the output side of the self-contained run PWM command value preparing section 30 to perform the self-contained run. At this time, the variation in PCS alternating current voltage in the power conversion system is suppressed.

4 Claims, 7 Drawing Sheets

U.S. PATENT DOCUMENTS

| | | | |
|---|---|---|---|
| 6,087,812 A * | 7/2000 | Thomas et al. | 320/141 |
| 6,121,756 A * | 9/2000 | Johnson et al. | 320/140 |
| 6,366,054 B1 * | 4/2002 | Hoenig et al. | 320/132 |
| 6,448,743 B2 * | 9/2002 | Sano et al. | 320/162 |
| 6,911,804 B2 * | 6/2005 | Mori | 320/132 |
| 7,187,531 B1 * | 3/2007 | Chen | 361/111 |
| 7,230,353 B2 * | 6/2007 | Hsu et al. | 307/66 |
| 7,558,087 B2 * | 7/2009 | Meysenc et al. | 363/35 |
| 7,612,468 B2 * | 11/2009 | Okui | 307/66 |
| 2005/0012395 A1 | 1/2005 | Eckroad et al. | |
| 2006/0068272 A1 * | 3/2006 | Takami et al. | 429/62 |
| 2007/0172734 A1 * | 7/2007 | Noguchi et al. | 429/223 |
| 2008/0145752 A1 * | 6/2008 | Hirose et al. | 429/164 |

FOREIGN PATENT DOCUMENTS

| | | |
|---|---|---|
| JP | 2006-509489 A | 3/2006 |
| JP | 2007-215378 A | 8/2007 |

* cited by examiner

CONTROL DEVICE FOR UNINTERRUPTIBLE POWER SUPPLY

TECHNICAL FIELD

The present invention relates to control device and control method for a power conversion system having functions of instantaneous voltage drop-service interruption counter-measure and, particularly, control device and control method for an alternating current-and-direct current conversion device which change a run mode from a system interconnection run to a self-contained run when an instantaneous voltage drop or a service interruption occurs.

BACKGROUND ART

Figure 2:
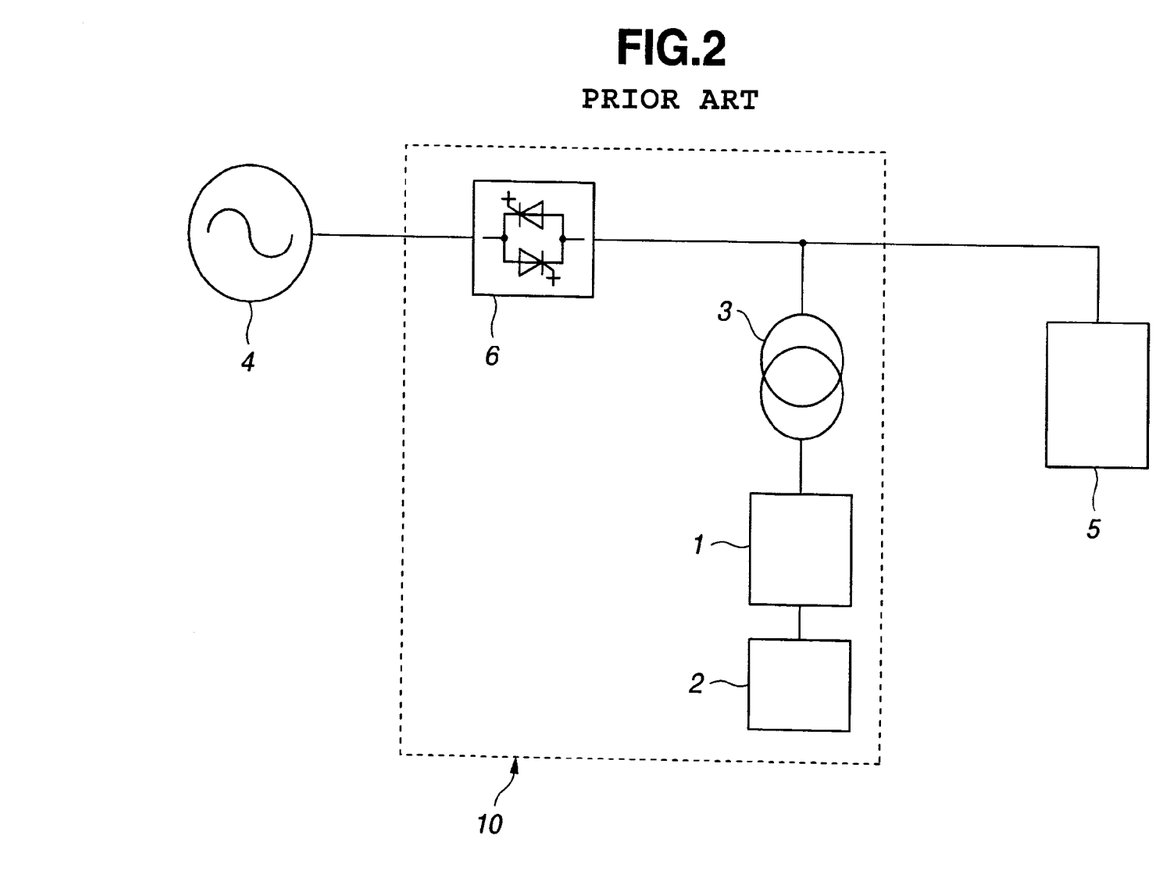
FIG. 2 is a structural diagram representing a conventional power conversion system.

FIG. 2 shows one example of a power conversion system in which alternating current-and-direct current conversion device having the instantaneous voltage drop and service interruption counter-measure functions is equipped. In FIG. 2, 1 denotes the alternating current-and-direct current conversion device constituted by a DC/AC converter. A direct-current side of alternating current-and-direct current conversion device 1 is connected to a power storage section 2 such as a battery cell of a NaS (Natrium Sulfide) cell, a lead storage battery, lithium ion battery, and so forth and such as a capacitor of an electrolyte capacitor, an electric double layer capacitor, and so forth. 3 denotes an interconnection transformer. Alternating current-and-direct current conversion device 1 is connected to a power system 4 and an important load 5 via this interconnection transformer 3. 6 denotes a high-speed switch interposed in an electric passage connected to an electric power system 4, interconnection transformer 3, and important load 5. It should be noted that a power conversion system, hereinafter, called PCS) 10 is constituted by alternating current-and-direct current conversion device 1, power storage section 2, interconnection transformer 3, and a high-speed switch 6.

Ordinarily, an electric power is supplied from electric power system 4 to important load 5. However, if the instantaneous voltage drop or the service interruption is developed, a control device of PCS not shown in FIG. 2 opens high-speed switch 6 so that the electric power stored in power storage section 2 is supplied to important load 5 via alternating current-and-direct current conversion device 1 and interconnection transformer 3. In the way described above, a switch control permits a maintenance of the supply of electric power to important load 5 even if the instantaneous voltage drop or the service interruption is developed. Hereinafter, such a device as described above is called "instantaneous voltage drop and service interruption compensation device". This device is commonly known as an uninterruptible power supply ("UPS").

Figure 3:
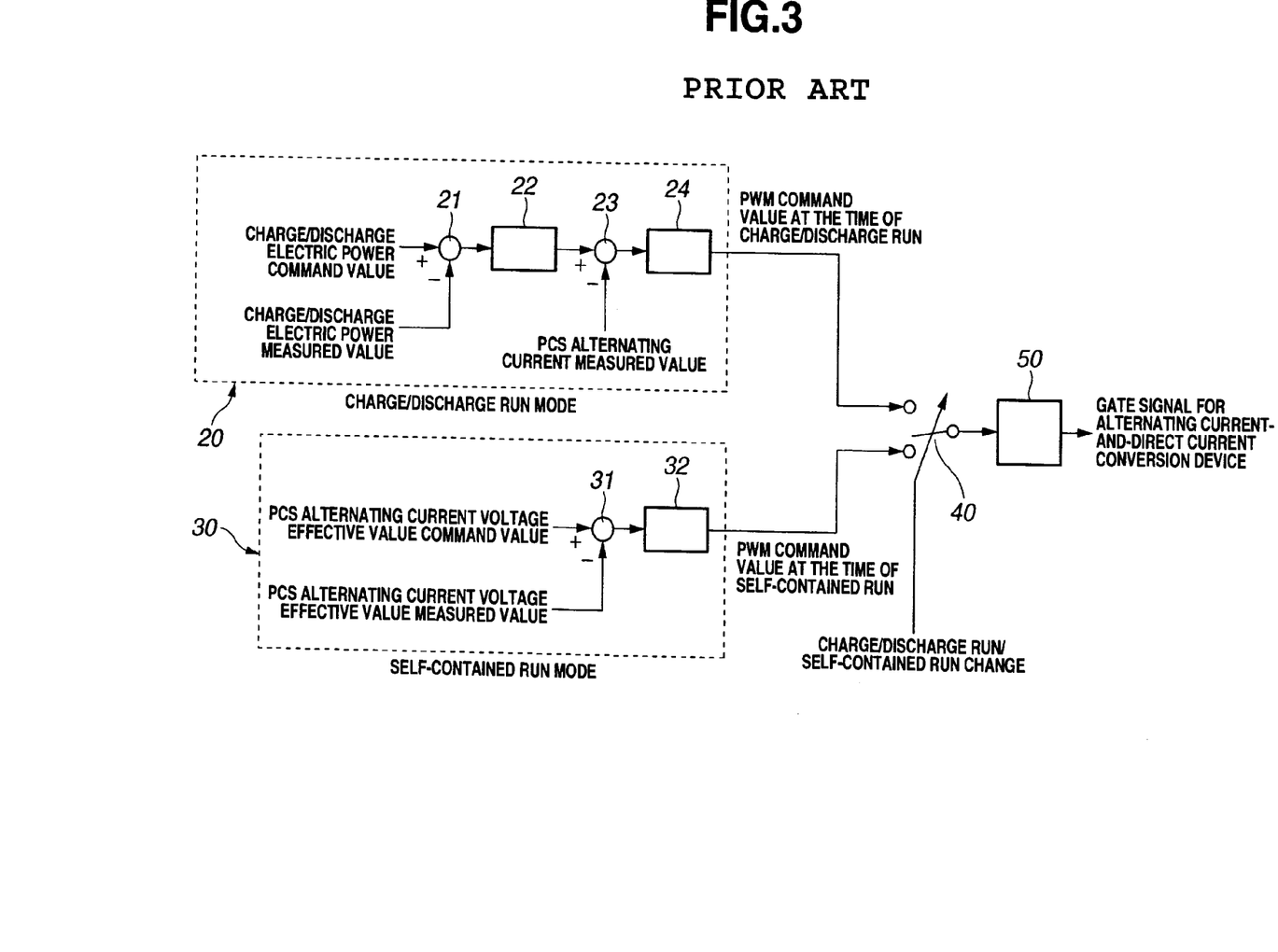
FIG. 3 is a control block diagram of a system in FIG. 2.

FIG. 3 shows a switch control block diagram during the instantaneous voltage drop and service interruption of the above-described "instantaneous voltage drop and power interruption compensation device".

In FIG. 3, 21 denotes a deviation circuit which takes a deviation between a charge/discharge (electric) power command value and a charge/discharge (electric) power measured value, namely, a power detection value at a primary (winding) side (system side) of interconnection transformer 3 in FIG. 2. 22 denotes an APR control circuit which performs a control, with an output of deviation circuit 21 as input, to make it coincide with the charge/discharge power command value. 23 denotes another deviation circuit which takes the deviation between an alternating current detection value which inputs into and outputs from alternating current-and-direct current conversion device 1 in FIG. 2. 24 denotes an ACR control circuit which prepares a PWM command value of a current control, with an output of deviation circuit 23 as the input thereof.

These deviation circuits 21 and 23, APR control circuit 22, and ACR control circuit 24 constitute charge/discharge run PWM command value preparing section 20.

31 denotes still another deviation circuit which takes the deviation between PCS alternating current voltage effective value command value and PCS alternating current voltage effective value measured value, namely, a voltage detection value (an system interconnection voltage which is the same as important load 5) at the primary (winding) side (a system side) of interconnection transformer 3 in FIG. 2. 32 denotes an AVR control circuit which prepares an PWM command value to perform a coincidence control to make PCS alternating current voltage effective value coincident with its command value.

These deviation circuit 31 and AVR control circuit 32 constitute a self-contained run PWM command value preparing section 30 and AVR control circuit 32.

40 denotes a change switch which changes between charge/discharge run PWM command value preparing section 20 and self-contained run PWM command value preparing section 30 according to the charge-discharge run/self-contained run.

50 denotes a PWM control section which is prepared for a PWM control signal, namely, a gate signal of alternating current-and-direct current conversion device 1 shown in FIG. 2 on a basis of a command value changed according to change switch 40.

In FIGS. 2 and 3, any one of three run modes of "charge run" during which an electric power of a power system is charged into power storage section 2, "discharge run" during which the electric power of the power storage section is discharged from power storage section 2, and "stand-by run" during which neither charge nor discharge is performed is carried out.

It should, herein, be noted that these charge run, discharge run, and stand-by run are totally called "charge/discharge run mode". During the charge run mode, change switch 40 in FIG. 3 is switched to charge/discharge run PWM command value preparing section 20. A controller, upon receipt of the charge/discharge electric power command value externally provided, performs a control (APR control) which makes the charge/discharge run PWM command value prepared coincident with the electric power command value. It should be noted that, during the stand-by run mode, this command value may be set to 0.

In addition, in a case where the instantaneous voltage drop or the service interruption occurs, the controller opens a passage of high-speed switch 6 shown in FIG. 2 and changes change switch 40 shown in FIG. 3 to self-contained run PWM command value preparing section 30, namely, self-contained run (AVR control). The self-contained run means that self-contained run discharges the electric power stored in electric power storage section 2 to make an effective value of PCS alternating current voltage coincident with the command value. This control permits a maintenance of the electric power supply to important load 5 even if the instantaneous voltage drop or the service interruption occurs.

As PCS 10 shown in FIG. 2, for example, described is in a non-patent document 1 is well known.

Non-patent document 1: PCS for NAS cell having functions of instantaneous voltage drop or service interruption counter-measure (MEIDEN REVIEW, pages 22 to 25 of 2006 No. 3).

DISCLOSURE OF THE INVENTION

Task to be Solved by the Invention

It is necessary to perform a change to "the self-contained run" at a high speed to maintain a stable electric power supply for an important load 5 in instantaneous voltage drop-service interruption-compensation device shown in FIGS. 2 and 3.

Figure 4:
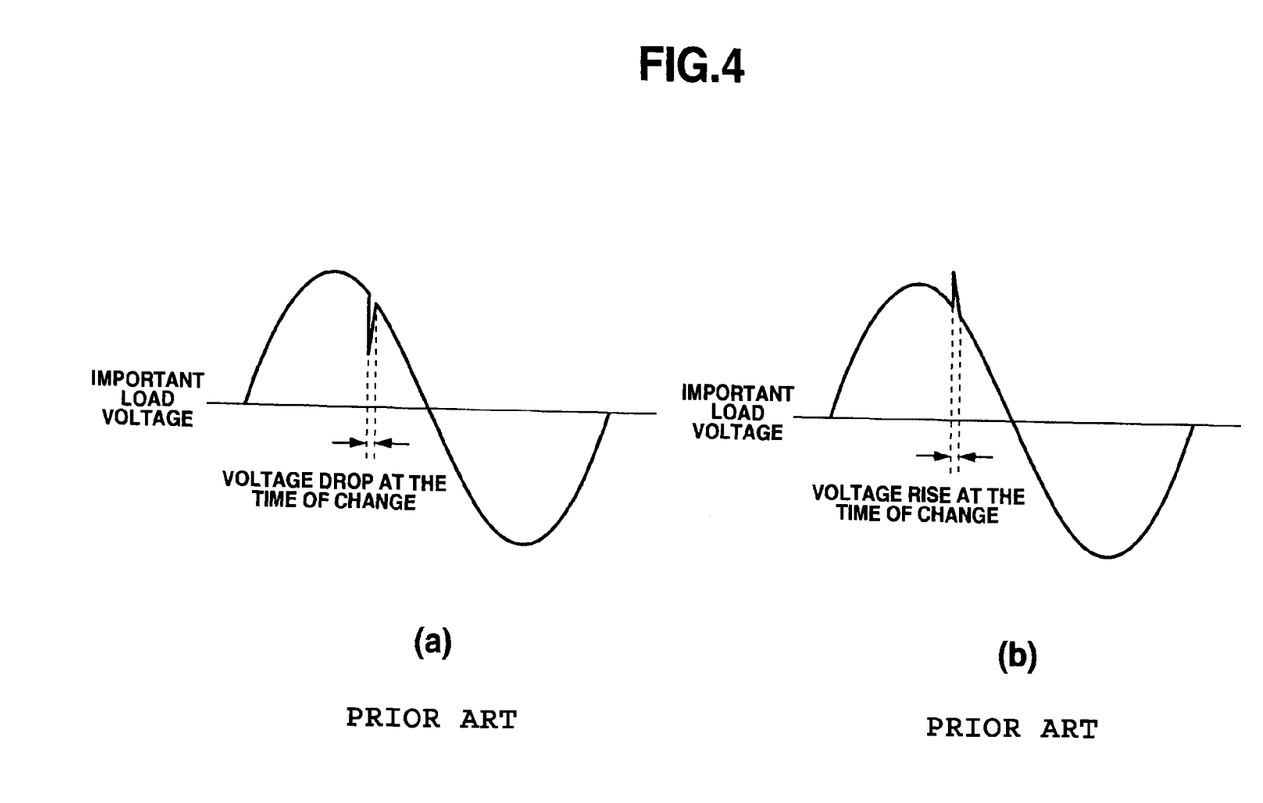
FIGS. 4(a) and 4(b) are voltage waveform charts representing variations in an important load voltage during a change from a charge/discharge run mode to a self-contained run mode in a conventional power conversion system.
Figure 5:
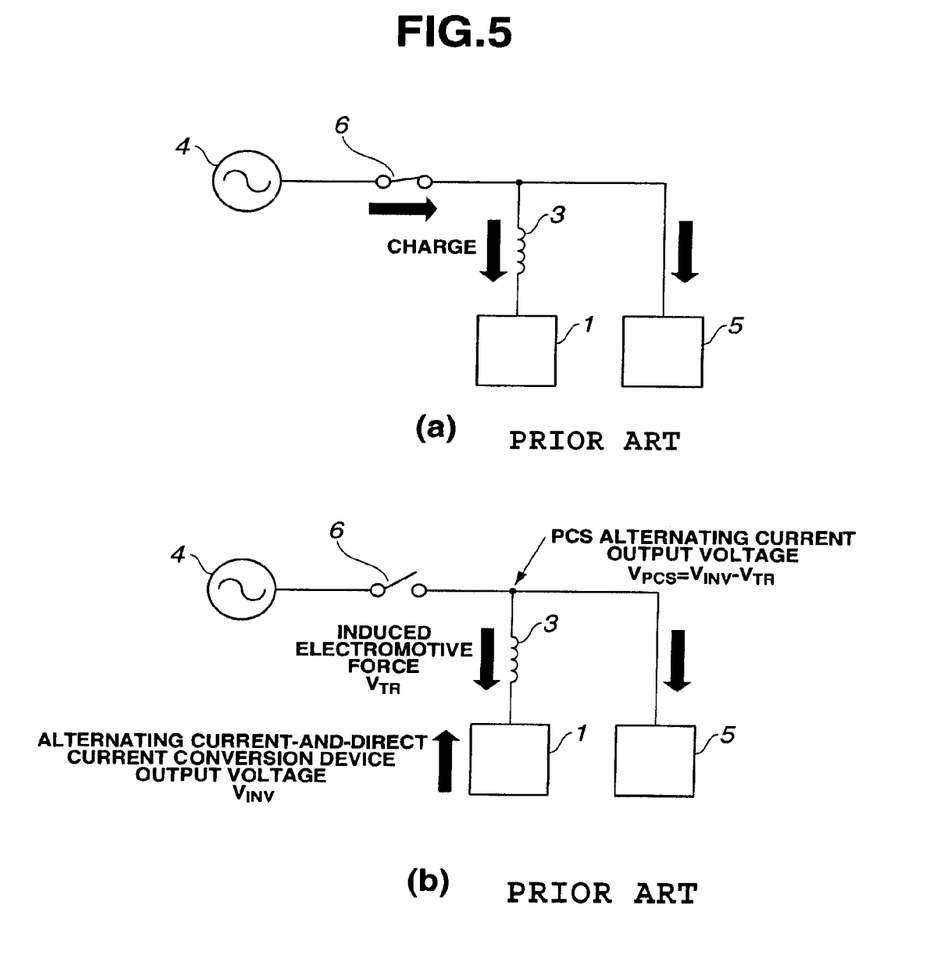
FIGS. 5(a) and 5(b) are explanatory views representing patterns of an electric power and voltage during the change from the charge run to the self-contained run in the conventional power conversion system.
Figure 6:
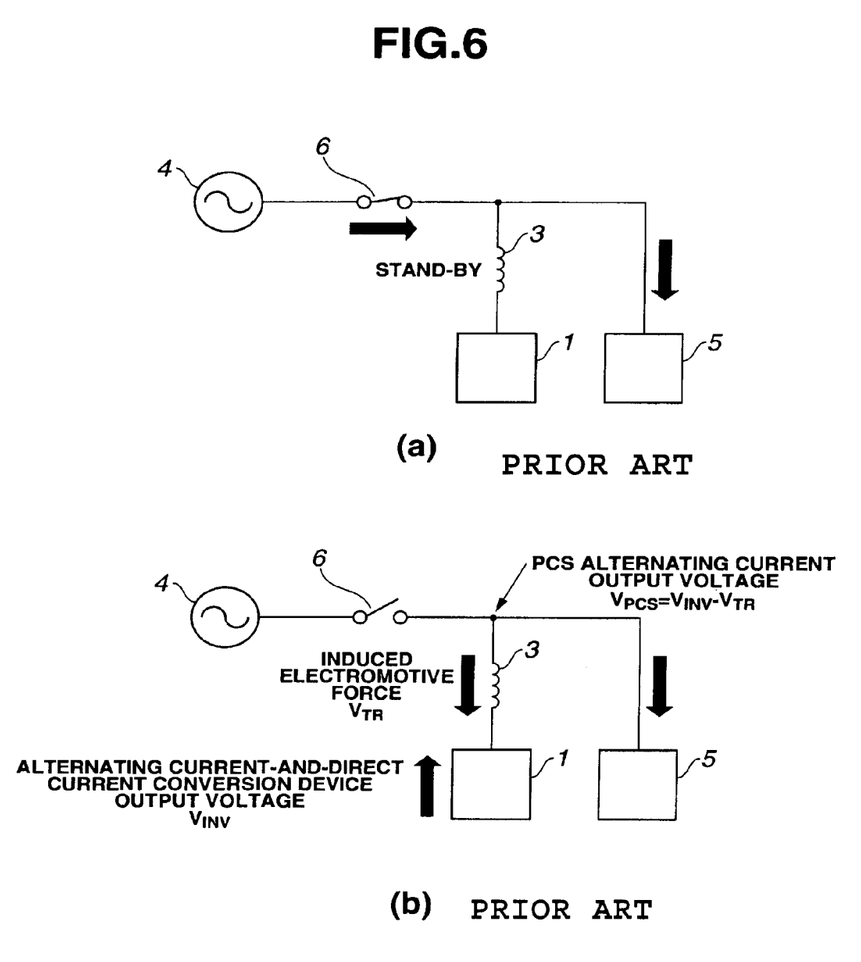
FIGS. 6(a) and 6(b) are explanatory views representing the patterns of the electric power and voltage during the change from a stand-by run to the self-contained run in the conventional power conversion system.
Figure 7:
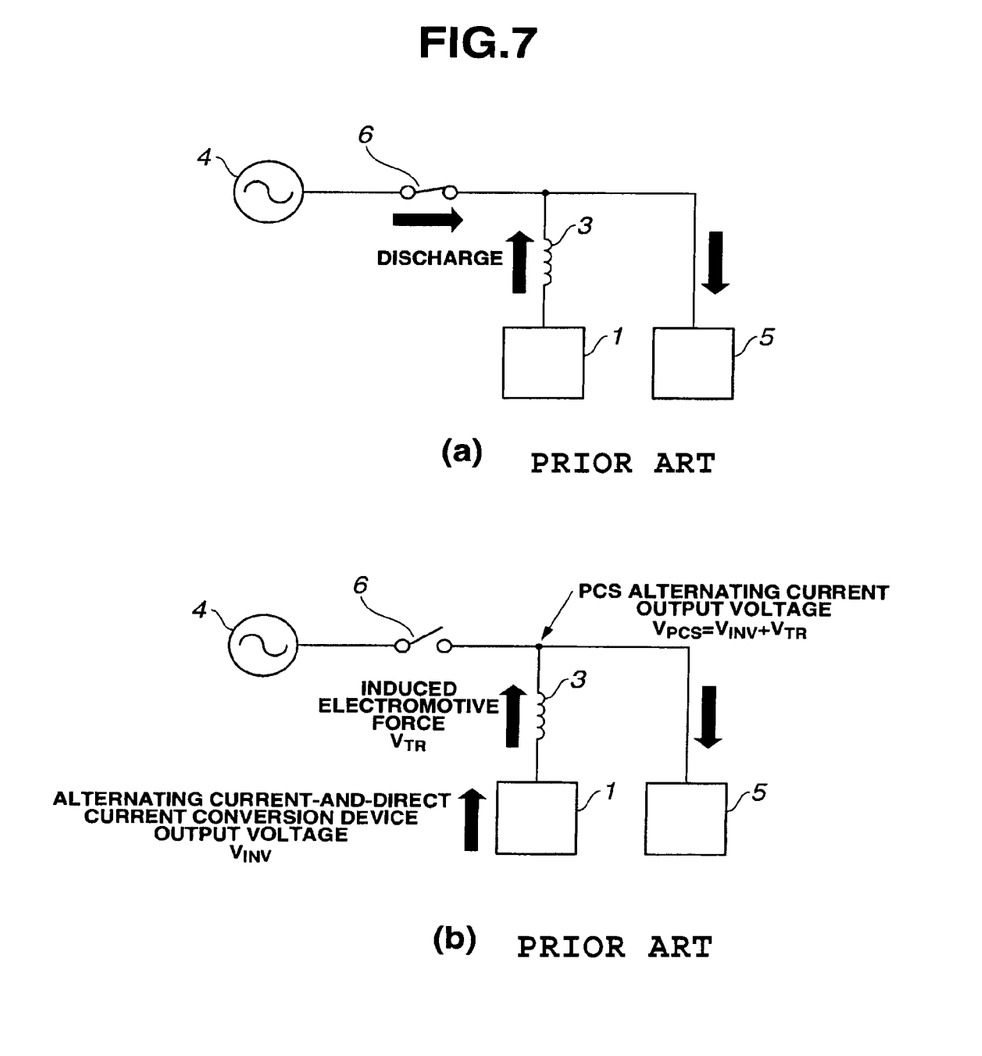
FIGS. 7(a) and 7(b) are explanatory views representing the patterns of the electric power and voltage during the change from the discharge run to the self-contained run in the conventional power conversion system.

However, when the change to "the self-contained run" is performed, a variation of a primary (winding) voltage (hereinafter, referred to as a PCS alternating current voltage of instantaneous interconnection transformer 3) is developed as shown in FIGS. 4(a) and 4(b) due to the charge/discharge run mode, an important load capacity, a responsive characteristic of the AVR control, and an induced electromotive force according to a leakage inductance of interconnection transformer 3. This voltage variation quantity is different dependent upon the charge/discharge run modes such as "the charge run", "stand-by run", "discharge run", and "charge run" as shown in FIGS. 5 through 7. In these FIGS. 5 through 7, the same parts as FIG. 2 are designated by the like reference numerals as FIG. 2. Power storage section 2 is shown with reference numeral 2 not shown in the drawings. Power storage section 2 is omitted in FIGS. 5 through 7 and, in order to facilitate the explanation, a leakage inductance L only is denoted for interconnection transformer 3.

Next, a variation of PCS alternating current voltage when the mode is changed from any one of the charge/discharge run modes to the self-contained run will be described hereinbelow.

If the instantaneous voltage drop or the service interruption occurs during the charge run or the stand-by run as shown in FIGS. 5 and 6, high-speed switch 6 is opened for the run mode to be changed to "the self-contained run". A current caused to flow through interconnection transformer 3 is varied sharply or abruptly from the charge current varied in accordance with a charge electric power command value to the discharge current varied in accordance with an important load capacity when the change from the charge run to the self-contained run is carried out. During the stand-by run, an abrupt variation of the current from zero current to the discharge current is carried out in accordance with the important load capacity.

As described above, if the current flowing through interconnection transformer 3 is abruptly or sharply varied, an induced electromotive force $V_{TR}$ due to the leakage inductance of interconnection transformer 3 is developed in a charge direction, namely, in a direction toward which a current supply to the load is hindered. PCS alternating current voltage $V_{PCS}$ at that time gives $V_{PCS}=V_{INV}-V_{TR}$ so as to be lower than $V_{INV}$ by induced electromotive force $V_{TR}$. This voltage reduction quantity is proportional to a time differential quantity of the current flowing through interconnection transformer 3 and a magnitude of leakage inductance L.

On the other hand, if the instantaneous voltage drop or the service interruption occurs during the discharge run as shown in FIG. 7, high-speed switch 6 is opened in the same way as the charge run or as the stand-by run so that the change is made from the discharge run to the self-contained run. At this time, the current caused to flow into interconnection transformer 3 is abruptly changed from the discharge current in accordance with the discharge electric power command value to the discharge current in accordance with the important load capacity.

For example, when the mode change from "the discharge run" at the discharge electric power command value which is smaller than the important load capacity to the self-contained run is made, the discharge electric power of alternating current-and-direct current conversion device 1 is increased. Hence, induced electromotive force $V_{TR}$ due to leakage inductance L of interconnection transformer 3 is developed in the charge direction in the same way as the charge run. PCS alternating current voltage $V_{PCS}$ at that time is given as $V_{PCS}=V_{INV}-V_{TR}$ so as to be reduced to a value lower than $V_{IN}$ by induced electromotive force $V_{TR}$. This voltage variation quantity is proportional to a time differential quantity of the current caused to flow into interconnection transformer 3 and the magnitude of leakage inductance L.

On the other hand, during the change at the discharge electric power command value larger than the important load capacity from "the discharge run" to "the self-contained run", the discharge electric power to the alternating current-and-direct current conversion device 1 is decreased so that induced electromotive force $V_{TR}$ due to leakage inductance L of interconnection transformer 3 is developed in the discharge direction. PCS alternating current $V_{PCS}$ at that time is given as $V_{PCS}=V_{INV}+V_{TR}$ so as to be larger than $V_{INV}$ by induced electromotive force $V_{TR}$. This voltage variation quantity is proportional to the time differential quantity of a current caused to flow into interconnection transformer 3 and the magnitude of leakage inductance L.

In addition, when high-speed switch 6 is opened for the run mode to be changed to the self-contained run, the voltage across an upper rank side (toward the system) high-speed switch 6 than an interruption current during the open is raised. Therefore, such a new circuit as a snubber circuit or an arrester device is needed to suppress such a voltage rise as described above.

It is, in view of the above-described point, an object of the present invention to provide control device and control method for a power conversion system having instantaneous voltage drop-service interruption counter-measure functions which are capable of suppressing a variation of PCS alternating current voltage during a change operation to "the self-contained run" due to the instantaneous voltage drop or due to the service interruption.

Means for Solving the Task

A control device for a power conversion system having instantaneous voltage drop-service interruption counter-measure functions as described in the claim 1 in order to solve the above-described task comprising: a high-speed switch interposed in an electric passage connected between an electric power system and an important load; an interconnection transformer having a primary winding side connected to a common junction between the high-speed switch and the important load; an alternating current-and-direct current conversion device having an alternating current side connected to a secondary winding side of the interconnection transformer and a direct current side connected to an electric power storage section and configured to perform a change of an electric power between the alternating current and the direct current; and control means for performing a constant current discharge run in which an electric power of the electric power storage section is discharged for a predetermined time duration at a predetermined constant current in order for an induced electromotive force due to a leakage inductance of an interconnection transformer developed during a change of a run mode to a self-contained run by means of the alternating current-and-direct current conversion device to be suppressed, during the change of the run mode from a system interconnection run which performs any one of a discharge run in which the electric power of the electric power system is charged into the electric power storage section by means of the alternating current-and-direct current conversion device, a stand-by run in which the electric power of the electric power system is supplied to an important load while the alternating current-and-direct current conversion device is in a stand-by state, and a discharge run in which the electric power of the electric power system and the electric power of the electric power storage section discharged by means of the alternating current-and-direct current conversion device are supplied to the important load to the self-contained run in which, while the instantaneous voltage drop or the service interruption occurs, the high-speed switch is opened in order for the electric power system to be separated from the important load and the electric power of the power storage section is discharged through the alternating current-and-direct current conversion device to be supplied to the important load.

A control method for a power conversion system having the instantaneous voltage drop and the service interruption functions described in the claim 3, the power conversion system comprising: the power conversion system comprising: a high-speed switch interposed in an electric passage connected between an electric power system and an important load;

an interconnection transformer having a primary winding side connected to a common junction between the high-speed switch and the important load;

an alternating current-and-direct current conversion device having an alternating current side connected to a secondary winding side of the interconnection transformer and a direct current side connected to an electric power storage section and configured to perform a change of an electric power between the alternating current and the direct current; and wherein the method comprises performing a constant current discharge run in which an electric power of the electric power storage section is discharged for a predetermined time duration at a predetermined constant current in order for an induced electromotive force due to a leakage inductance of an interconnection transformer developed during a change of a run mode to a self-contained run by means of the alternating current-and-direct current conversion device to be suppressed, during the change of the run mode from a system interconnection run which performs any one of a discharge run in which the electric power of the electric power system is charged into the electric power storage section by means of the alternating current-and-direct current conversion device, a stand-by run in which the electric power of the electric power system is supplied to an important load while the alternating current-and-direct current conversion device is in a stand-by state, and a discharge run in which the electric power of the electric power system and the electric power of the electric power storage section discharged by means of the alternating current-and-direct current conversion device are supplied to the important load to the self-contained run in which, while the instantaneous voltage drop or the service interruption occurs, the high-speed switch is opened in order for the electric power system to be separated from the important load and the electric power of the power storage section is discharged through the alternating current-and-direct current conversion device to be supplied to the important load.

In the above-described structure, control means performs the constant current discharge run during the switch from the system interconnection run to the self-contained run, namely, performs the discharge for the predetermined time duration for the predetermined constant current from the power storage section via the alternating current-and-direct current conversion apparatus.

Conventionally, in a case where the instantaneous change from the system interconnection run to the self-contained run is made, the induced electromotive force according to the leakage inductance of the interconnection transformer is generated so that PCS alternating current voltage variation is developed.

However, according to the structure of the present invention, the constant current discharge run is carried out for the predetermined time period so that a current variation rate (di/dt) flowing through the interconnection during the change from system interconnection run to the self-contained run can be made small. Hence, the induced electromagnetic force due to the leakage resistance according to the leakage inductance of the interconnection transformer can be suppressed. A stable power supply without an ill influence on the load is continued.

In addition, since, as described hereinabove, the variation in PCS alternating current voltage is suppressed, the voltage rise at the electric power system side of the high-speed switch developed when the high-speed switch is opened while the change to the self-contained run is carried out can be suppressed. Thus, the snubber circuit or the arrester device that has conventionally been required is not needed so that the space saving for the whole system and the cost saving can be achieved.

In the control device for the electric power conversion system having instantaneous voltage drop-service interruption counter-measure functions as claimed in claim 1 described in the claim 2, the predetermined constant current discharged during the constant current discharge run is equal to the important load current.

In the control method for the power conversion system having instantaneous voltage drop-service interruption counter-measure functions as claimed in claim 3 described in the claim 4, the predetermined constant current discharged when the constant current discharge run is carried out is equal to the important load current.

In the above-described structure, the discharge current during the constant current discharge run is equal to an important load current and the voltage rise at the electric power system side of the high-speed switch developed when the high-speed switch is opened hardly occurs. Thus, the variation in PCS alternating current voltage during the change to the self-contained run can furthermore be reduced.

Effect of the Invention (1) According to the invention described in the claims 1 through 4, the constant current discharge is performed during the switch from the system interconnection run to the self-contained run so that a current variation rate (di/dt) flowing through the interconnection transformer can be reduced. The induced electromotive force due to the leakage inductance of the interconnection transformer can be suppressed. Thus, a stable electric power supply is continued without an ill influence of a load by suppressing the variation of PCS alternating current voltage during the change to the self-contained run.

In addition, as described before, the variation in PCS alternating current voltage is suppressed and the current increase in the high-speed switch due to the voltage reduction of the PCS alternating current voltage can be prevented. Thus, the voltage rise at the electric power system side of the high-speed switch developed when the high-speed switch is opened while the change to the self-contained run is carried out can be suppressed. Thus, the snubber circuit or the arrester device that has conventionally been required is not needed so that the space saving for the whole system and the cost saving can be achieved.

(2) Furthermore, as the present invention described in the claims 2 and 4, the constant current discharged during the constant current discharge run is equal to the important load current. Hence, a current flowing through the high-speed switch can be suppressed to zero or remarkably to a large degree. Thus, the voltage rise at the electric power system side of the high-speed switch hardly occurs. Therefore, the variation in PCS alternating current voltage during the change to the self-contained run can more remarkably be reduced.

Best Mode for Carrying Out the Invention

Hereinafter, a preferred embodiment according to the present invention will be described with reference to accompanied drawings in order to facilitate a better understanding of the present invention. However, the present invention is not limited to the preferred embodiment. As described hereinbefore, PCS alternating current voltage variation during a change operation of the "self-contained run" is different according to the charge/discharge run mode. A primary (side) voltage of interconnection transformer 3 is reduced during "the charge run" and "the stand-by run". On the other hand, the above-described primary (side) voltage of interconnection transformer 3 is reduced during the charge run or the stand-by run. On the other hand, the primary (side) voltage is reduced when the discharge capacity is smaller than the important load capacity, even during the discharge run. However, the primary (side) voltage thereof is raised when the discharge capacity is larger than the important load capacity.

The instantaneous voltage drop or the service interruption is generated during the charge/discharge run mode. Before the change to "the self-contained run", "the constant current discharge run" is carried out for an instantaneous time duration (for example, about 1.0 millisecond). Thereafter, "the self-contained run" is carried out so that the variation in the primary voltage can be suppressed. This is a principle according to the present invention.

This method is effective for not only the charge run in FIGS. 5(*a*) and 5(*b*) but also for the stand-by run or the discharge run in FIGS. 6(*a*) to 7(*b*).

Figure 1:
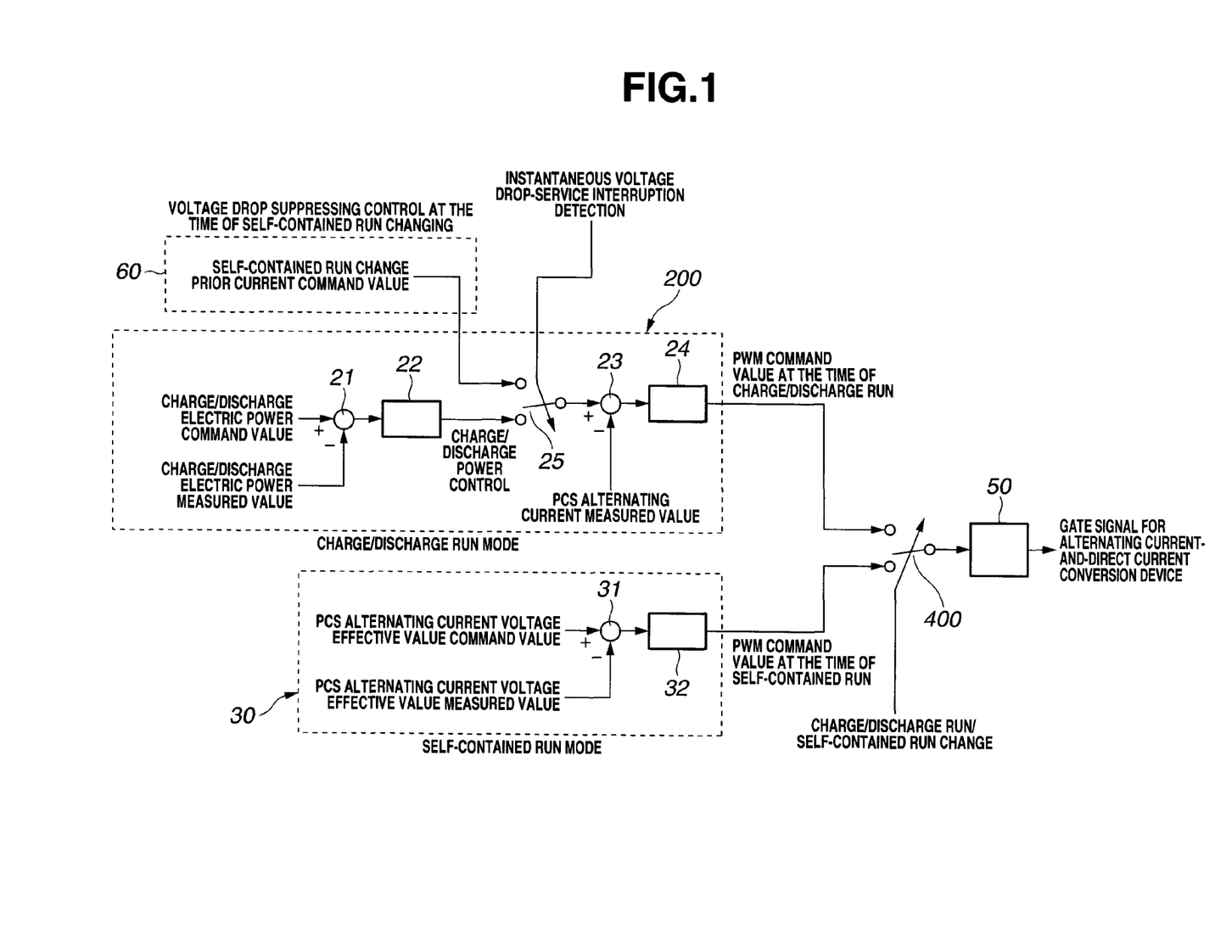
FIG. 1 is a control block diagram of one example of a preferred embodiment according to the present invention.

FIG. 1 is a control block diagram of control means representing a preferred embodiment according to the present invention. The same reference numerals shown in FIG. 1 as those in FIG. 3 designate like parts and its description will herein be omitted.

Parts of FIG. 3 which are different from FIG. 1 include provisions of "a self-contained run change prior current command value preparing section 60" and of another change switch 25 configured to perform a change control in response to the instantaneous voltage drop-or-service interruption detection signal between an output (charge/discharge power control) of APR control circuit 22 and an output of the self-contained run prior current command value preparing section 60 (self-contained run change voltage reduction suppression control=a constant current discharge run according to the present invention) and which are interposed between APR control circuit 22 and deviation circuit 23 of charge/discharge run PWM command value preparing section 200; and a still another change switch 400 which performs the change control in response to a charge/discharge run/self-contained run mode change command between the output of "charge/discharge run PWM command value preparing section 200" and the output of "the self-contained run PWM command value preparing section 30".

In the device configured as described above, while a system voltage is ordinarily stable, change switch 25 is changed to the output side of APR control circuit 22, change switch 400 is continuously placed at the output side of charge/discharge run PWM command value preparing section 200. At this time, the state of the run (a system interconnection run according to the present invention) in the charge/discharge run mode occurs.

It should be noted that, if instantaneous voltage drop or the service interruption occurs, change switch 25 is changed to the output side of self-contained run change prior current command value preparing section 60, which is continued to be positioned at the output side of charge/discharge run prior PWM command value preparing section 200 so as to perform the discharge control (a constant current discharge run) in response to the current command value of "the self-contained run change prior command value preparing section" 60 and this constant current discharge run is continued for an arbitrary setting time. Then, after the setting time has elapsed, change switch 400 is switched to the output side of "the self-contained run PWM command value preparing section 30 to perform the change to the "self-contained run".

The above-described "self-contained run change prior current command value" is, for example, set to any one of the values which is equal to the important load current; a device rated current which does not affect electric power system 4 nor important load 5 even if the important load capacity is equal to or lower than a device rating, since this mode interval of time is, as short as, for example, 1.0 millisecond; and a PWM modulation rate maximum value of alternating current-and-direct current conversion device 1 (since this mode interval of time is as short as, for example, 1.0 millisecond, no influence on electric power system 4 and important load 5 is given).

From among this three kinds of currents, if the discharge having only the same current as the above-described important load current is carried out, a current caused to flow through the high-speed switch can be suppressed to zero or remarkably to the large degree. The variation in PCS alternating current voltage becomes a smallest. However, in order to simplify the control, as the fixed value, any one of above-described "device rating current value", "a maximum value of PWM modulation rate of an alternating current-and-direct current conversion device" may be used.

In the way described above, the constant current discharge run is performed for a predetermined time duration. In order to reduce a current variation rate (di/dt) flowing through the interconnection transformer, the induced electromotive force due to a presence of the leakage inductance of the interconnection transformer can be suppressed. When the run mode is changed to the self-contained run after the predetermined time has elapsed, induced electromotive force ($V_{TR}$) described with reference to FIGS. 5 through 7 can be suppressed and PCS alternating current voltage variation can be suppressed.

A continuation time for the constant current discharge run is dependent upon to what degree the change time of the self-contained run is shortened or to what degree the voltage variation is suppressed. Ordinarily, the value of voltage variation may be set to 0.1 milliseconds to 1.0 millisecond.

Furthermore, according to the above-described preferred embodiment, the variation in the primary voltage (important load voltage) of interconnection transformer 3 can be suppressed. A current increase of the high-speed switch caused by the voltage drop of PCS alternating current voltage can be prevented. A voltage rise in an upper rank side of the high-speed switch caused by the voltage drop of PCS alternating current voltage can be prevented. Thus, the voltage rise at the upper rank side of the high-speed switch developed at the time of opening of the high-speed switch when the run mode is changed from the charge/discharge run mode to the instantaneous voltage drop and the service interruption can be suppressed. Consequently, the device for suppressing the high-speed switch such as a snubber circuit or arrester device conventionally required is not necessary. Then, these can contribute on space saving and cost reduction.

It should be noted that the present invention is applicable not only to important load 5 but also to another load connected to the electric power system.

EXPLANATION OF SIGNS

1 . . . alternating current-and-direct conversion device
2 . . . electric power storage section
3 . . . interconnection transformer
4 . . . electric power system
5 . . . important load
6 . . . high-speed switch
10 . . . PCS (Power Conversion System)
21, 23, 31 . . . deviation circuits
22 . . . APR control circuit
24 . . . ACR control circuit
25, 400 . . . change switch
30 . . . self-contained run PWM command value preparing section
32 . . . AVR control circuit
50 . . . PWM control section
60 . . . self-contained run change prior current command value preparing section
200 . . . charge/discharge run PWM command value preparing section

What is claimed is:

1. A control device for an uninterruptible power supply (UPS) comprising:
a high-speed switch interposed in an electric passage connected between an electric power system and a load;
an interconnection transformer having a primary winding side connected to a common junction between the high-speed switch and the load;
an alternating current-and-direct current conversion device having an alternating current side connected to a secondary winding side of the interconnection transformer and a direct current side connected to an electric power storage section and configured to perform a change of an electric power between the alternating current and the direct current;
the high-speed switch, the interconnection transformer and the alternating current-and-direct current conversion device, all provided in the UPS, the UPS operating in any one mode of the following three runs, as a normal operating mode in which system voltage is stable and instantaneous voltage drop or service interruption does not occur:
(a) a charge run in which electric power of the electric power system is supplied to the load while charging the electric power storage section through the alternating current-and-direct current conversion device,
(b) a stand-by run in which the electric power of the electric power system is supplied to the load while the alternating current-and-direct current conversion device is in a stand-by state,
(c) a discharge run in which both the electric power of the electric power system and the electric power of the electric power storage section discharged through the alternating current-and-direct current conversion device are supplied to the load,
the UPS also operating, when the instantaneous voltage drop or service interruption occurs, in a mode of (d) a self-contained run in which the high-speed switch is opened to separate the electric power system and the load, then the electric power of the electric power storage section is supplied to the load through the alternating current-and-direct current conversion device; and
a controller which performs, before the normal operating mode of one of (a), (b) and (c) is changed to (d) the self-contained run upon the occurrence of the instantaneous voltage drop or the service interruption, a constant current discharge run in which the electric power of the power storage section is discharged at a predetermined constant current for a predetermined time to suppress an induced electromotive force due to a leakage inductance of the interconnection transformer which occurs upon the operating mode change from one of (a), (b) and (c) to (d), the self-contained run, and
after performing the constant current discharge run, the normal operating mode being changed to (d) the self-contained run that supplies the electric power to the load.

2. The control device for the UPS as claimed in claim 1, wherein the predetermined constant current discharged during the constant current discharge run is equal to the load current.

3. A method for controlling an uninterruptible power supply (UPS), the UPS provided with a high-speed switch interposed in an electric passage connected between an electric power system and a load; an interconnection transformer having a primary winding side connected to a common junction between the high-speed switch and the load; an alternating current-and-direct current conversion device having an alternating current side connected to a secondary winding side of the interconnection transformer and a direct current side connected to an electric power storage section and configured to perform a change of an electric power between the alternating current and the direct current, and the UPS operating in any one mode of the following three runs, as a normal operating mode in which system voltage is stable and instantaneous voltage drop or service interruption does not occur:

(a) a charge run in which electric power of the electric power system is supplied to the load while charging the electric power storage section through the alternating current-and-direct current conversion device, (b) a stand-by run in which the electric power of the electric power system is supplied to the load while the alternating current-and-direct current conversion device is in a stand-by state, (c) a discharge run in which both the electric power of the electric power system and the electric power of the electric power storage section discharged through the alternating current-and-direct current conversion device are supplied to the load, the UPS also operating, when the instantaneous voltage drop or service interruption occurs, in a mode of (d) a self-contained run in which the high-speed switch is opened to separate the electric power system and the load, then the electric power of the electric power storage section is supplied to the important load through the alternating current-and-direct current conversion device, the method comprising:

performing, before the normal operating mode of one of (a), (b) and (c) is changed to (d) the self-contained run upon the occurrence of the instantaneous voltage drop or the service interruption, a constant current discharge run in which the electric power of the electric power storage section is discharged at a predetermined constant current for a predetermined time to suppress an induced electromotive force due to a leakage inductance of the interconnection transformer which occurs upon the operating mode change from one of (a), (b) and (c) to (d) the self-contained run, and after performing the constant current discharge run, changing the normal operating mode to (d) the self-contained run that supplies the electric power to the load.

4. The control method for controlling the UPS as claimed in claim 3, wherein the predetermined constant current discharged during the constant current discharge run is equal to the load current.

* * * * *

UNITED STATES PATENT AND TRADEMARK OFFICE
CERTIFICATE OF CORRECTION

| | | |
|---|---|---|
| PATENT NO. | : 8,207,632 B2 | Page 1 of 1 |
| APPLICATION NO. | : 12/521161 | |
| DATED | : June 26, 2012 | |
| INVENTOR(S) | : Junichi Shimomura, Satoru Ohishi and Kenichi Suzuki | |

It is certified that error appears in the above-identified patent and that said Letters Patent is hereby corrected as shown below:

Title page

The Foreign Application Priority Data should read as:

item [30]    Foreign Application Priority Data

Jan. 12, 2007  [JP]                 2007-004082

Signed and Sealed this
Eighteenth Day of September, 2012

David J. Kappos
*Director of the United States Patent and Trademark Office*